United States Patent
Jørgensen et al.

(10) Patent No.: US 11,598,821 B2
(45) Date of Patent: Mar. 7, 2023

(54) LEAKAGE CURRENT DETECTION FROM BIAS VOLTAGE SUPPLY OF MICROPHONE ASSEMBLY

(71) Applicant: KNOWLES ELECTRONICS, LLC, Itasca, IL (US)

(72) Inventors: Tore Sejr Jørgensen, Taastrup (DK); Allan Nielsen, Roskilde (DK)

(73) Assignee: KNOWLES ELECTRONICS, LLC., Itasca, IL (US)

( * ) Notice: Subject to any disclaimer, the term of this patent is extended or adjusted under 35 U.S.C. 154(b) by 394 days.

(21) Appl. No.: 16/729,235

(22) Filed: Dec. 27, 2019

(65) Prior Publication Data

US 2020/0233039 A1    Jul. 23, 2020

Related U.S. Application Data

(60) Provisional application No. 62/795,525, filed on Jan. 22, 2019.

(51) Int. Cl.
| | |
|---|---|
| G01R 31/52 | (2020.01) |
| G01R 31/56 | (2020.01) |
| H03F 3/181 | (2006.01) |
| H03M 1/12 | (2006.01) |
| H04R 1/04 | (2006.01) |
| H04R 3/04 | (2006.01) |
| H04R 19/04 | (2006.01) |

(52) U.S. Cl.
CPC ............. *G01R 31/52* (2020.01); *G01R 31/56* (2020.01); *H03F 3/181* (2013.01); *H03M 1/12* (2013.01); *H04R 1/04* (2013.01); *H04R 3/04* (2013.01); *H04R 19/04* (2013.01); *H03F 2200/03* (2013.01); *H04R 2201/003* (2013.01)

(58) Field of Classification Search
CPC .. H04R 19/04; H04R 2201/003; H04R 31/00; H03G 3/00; H03G 3/20; H03G 3/3005
USPC ...... 324/510; 381/113, 107, 174, 56, 58, 91, 381/95, 111, 122, 355
See application file for complete search history.

(56) References Cited

U.S. PATENT DOCUMENTS

| | | | |
|---|---|---|---|
| 7,190,038 B2 | 3/2007 | Dehe et al. | |
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 8,592,877 B2* | 11/2013 | Lakamraju | B81C 1/00246 257/254 |
| 2004/0178918 A1* | 9/2004 | Lockhart | G01R 19/16542 324/429 |

(Continued)

OTHER PUBLICATIONS

International Search Report and Written Opinion, PCT/US2019/068781, Knowles Electronics, LLC (dated Mar. 26, 2020).

*Primary Examiner* — Alexander Krzystan
(74) *Attorney, Agent, or Firm* — Foley & Lardner LLP

(57) ABSTRACT

The present disclosure relates in a first aspect to a method of detecting leakage current from a DC bias voltage circuit of an integrated circuit for a capacitive microelectro mechanical systems (MEMS) transducer. A test signal with a predetermined frequency and level is superimposed on a first DC bias voltage generated by the DC bias voltage circuit.

25 Claims, 3 Drawing Sheets

(56) References Cited

U.S. PATENT DOCUMENTS

| | | |
|---|---|---|
| 2005/0207605 A1 | 9/2005 | Dehe et al. |
| 2007/0278501 A1 | 12/2007 | MacPherson et al. |
| 2007/0281379 A1* | 12/2007 | Stark .................. B81B 3/0021 |
| | | 438/50 |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2009/0320557 A1* | 12/2009 | Sammoura ......... B81C 99/0045 |
| | | 73/9 |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2012/0043974 A1 | 2/2012 | Van Den Boom et al. |
| 2016/0073212 A1 | 3/2016 | Zeleznik |
| 2017/0245036 A1* | 8/2017 | Kuki ......................... C08J 7/00 |
| 2018/0152791 A1 | 5/2018 | Wang |
| 2019/0383878 A1* | 12/2019 | Coenen ................ H02J 7/0048 |
| 2020/0204926 A1* | 6/2020 | Gabai .................... H04R 19/04 |
| 2020/0329324 A1* | 10/2020 | Loeppert ................. H04R 3/04 |

* cited by examiner

LEAKAGE CURRENT DETECTION FROM BIAS VOLTAGE SUPPLY OF MICROPHONE ASSEMBLY

CROSS REFERENCE TO RELATED APPLICATION

This application claims priority to and the benefit of U.S. Provisional Patent Application No. 62/795,525, entitled "Leakage Current Detection From Bias Voltage Supply of Microphone Assembly," filed Jan. 22, 2019, the contents of which are incorporated by reference herein in their entirety.

FIELD OF THE DISCLOSURE

The present disclosure relates generally to microphone assemblies, such as, but not limited to, those with microelectromechanical systems (MEMS) transducers.

BACKGROUND

Today's portable communication device typically comprises one or several microphone assemblies that are coupled to a data bus of the portable communication device via a standardized data communication interface. A digital microprocessor or digital signal processor (DSP), i.e. host processor, of the portable communication device typically comprises a corresponding standardized data communication interface for receipt of a data streams, or several time-multiplexed data streams, generated by the one or more digital microphone assemblies. The host processor of the portable communication device is typically configured or programmed to manipulate digital microphone signals generated by the microphone assemblies to create various desirable enhancements to the incoming sound such as beamforming, noise suppression, feedback cancellation etc.

The microphone assembly typically comprises a capacitive sound transducer for capture and conversion of incoming sounds or acoustic signals in the audible range, i.e. a capacitive microelectromechanical systems (MEMS) transducer, into a corresponding transducer audio signal. The microphone assembly also comprises an integrated circuit, which may include a semiconductor die for example a mixed-signal CMOS semiconductor die integrating various analog and digital circuits, in particular a DC bias voltage circuit that is configured to supply a DC bias voltage between a diaphragm and a back plate of the capacitive MEMS transducer through interconnecting pads and wires. The purpose of the DC bias voltage circuit is to put electrical charge on the diaphragm and back plate such that relative motion between the diaphragm and back plate can be detected as an electrical signal representative of incoming sound in the audible range. However, the output impedance of the DC bias voltage circuit is often extremely high, e.g. above 1 T$\Omega$, to ensure proper operation of the capacitive MEMS transducer element because of a very high generator impedance of the capacitive MEMS transducer as discussed below.

The inventors have realized that the provision of this extremely high output impedance of the DC bias voltage circuit represents a significant challenge to the manufacture of both the capacitive MEMS transducer element and the integrated circuit.

More specifically, various physical defects on the integrated circuit and/or on the capacitive MEMS transducer lead to a flow of leakage current from the output of the DC bias voltage circuit. This leakage current seriously deteriorates the output impedance of the DC bias voltage circuit and reduces performance of the microphone assembly. Furthermore, these physical defects on the integrated circuit and/or on the MEMS transducer may indicate that the integrated circuit and/or MEMS transducer element is/are defective or potentially unreliable and therefore may fail during a lifetime of the microphone assembly. There are several causes of these physical defects on the integrated circuit and/or on the capacitive MEMS transducer which include high voltage screen induced leaky dielectric overstress, assembly line ESD/EOS, various defects of the capacitive MEMS transducer element, contamination or leakage occurring after bonding or assembly due to contamination, bias pad stack collapse due to excess bonding force causing bias leakage etc.

Consequently, it is desirable to detect abnormal, or unusually high, leakage currents from the DC bias voltage circuit of the integrated circuit, either during wafer level testing where the integrated circuit may be tested in isolation, or during microphone assembly testing where operation of the combined integrated circuit and capacitive MEMS transducer is tested. In either case, devices failing the leakage current test may be identified and scrapped or screened out.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

DETAILED DESCRIPTION

Figure 1:
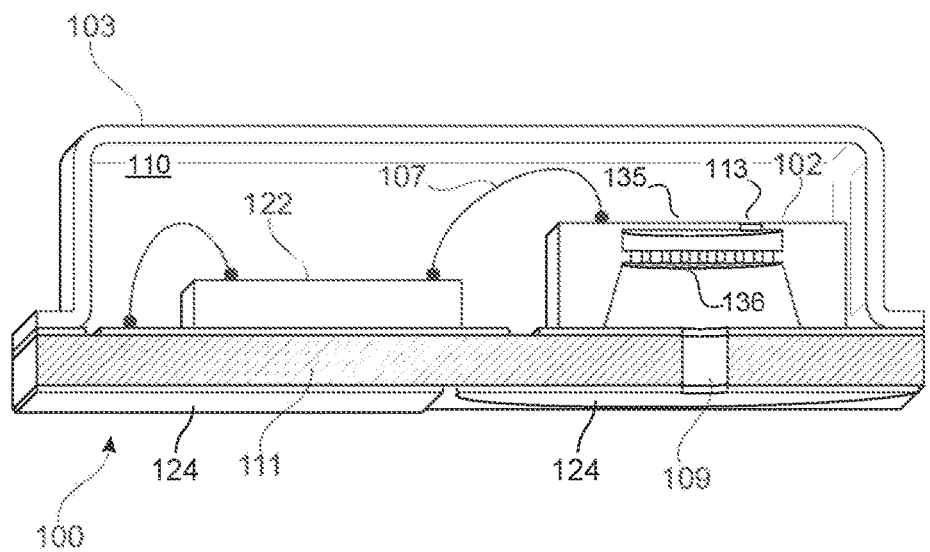
FIG. 1 shows a lateral cross-sectional view of an exemplary miniature microphone assembly comprising an integrated circuit electrically coupled to a MEMS transducer element.

In the following a detailed description of various embodiments of the present method of detecting leakage current from a DC bias voltage circuit are described with reference to the appended drawings. The skilled person will understand that the accompanying drawings are schematic and simplified for clarity and therefore merely show details which are essential to the understanding of the present disclosure, while other details have been left out. Like reference numerals refer to like elements or components throughout. Like elements or components will therefore not necessarily be described in detail with respect to each figure. It will further be appreciated that certain actions and/or steps may be described or depicted in a particular order of occurrence while those skilled in the art will understand that such specificity with respect to sequence is not actually required.

A first aspect of the disclosure relates to a method of detecting leakage current from a DC bias voltage circuit of an integrated circuit for a capacitive microelectromechanical systems (MEMS) transducer, said method comprising: generating a first DC bias voltage by a DC bias voltage circuit, lowpass filtering the first DC bias voltage to generate a second DC bias voltage, applying the second DC bias voltage to first and second bias voltage pads of the DC bias voltage circuit when the capacitive MEMS transducer, or an equivalent test capacitor, is coupled to the first and second bias voltage pads; superimposing a test signal with a predetermined frequency and level onto the first DC bias voltage when the second DC bias voltage is applied to the first and second bias voltage pads and detecting a level of the test signal after buffering or amplifying the test signal with a microphone buffer or preamplifier of the integrated circuit coupled to an output of the capacitive MEMS transducer, or through the equivalent test capacitor. The level of the test signal may be expressed by an RMS voltage or current of the test signal, an average voltage or current of test signal, a peak-peak voltage or current amplitude of the test signal etc.

In some embodiments, superimposing the test signal includes superimposing a test signal having a fundamental frequency between 10 Hz and 200 Hz. In some embodiments, superimposing the test signal includes generating the test signal with a signal generator of the integrated circuit and coupling the test signal into the DC bias voltage circuit. In some embodiments, the method further includes generating the test signal by modulating, at the predetermined frequency, a programmable reference voltage generator of the DC bias voltage circuit and applying a modulated output of the programmable reference voltage generator to a reference voltage input of a boost DC-DC converter of the DC bias voltage circuit. In some embodiments, the method also includes modulating the output of the reference voltage input by writing a sequence of instructions through a data communication interface of the integrated circuit to the reference voltage generator to toggle, at the predetermined frequency, an output voltage or current of the reference voltage generator between at least two different levels. In some embodiments, superimposing the test signal includes applying the test signal generated by an external signal generator to a communication interface of the integrated circuit and coupling the test signal into the DC bias voltage circuit. In some embodiments, the method further includes generating a digital test signal by sampling and quantizing the test signal with an analog-to-digital converter (ADC) of the integrated circuit after buffering or amplifying the test signal, and transmitting the digital test signal from the integrated circuit via a data communication interface of the integrated circuit before detecting the level of the test signal. In some embodiments, the lowpass filtering of the first DC bias voltage includes applying the first DC bias voltage via a pair of antiparallel diodes coupled in series with the first DC bias voltage, and via a filter capacitor coupled from an output of the pair of antiparallel diodes to a ground potential of the integrated circuit. In some embodiments, the method further includes selecting a fundamental frequency of the test signal such that it is least one decade higher than a nominal cut-off frequency of a lowpass filter performing the lowpass filtering of the first DC bias voltage.

The present method of detecting leakage current from the DC bias voltage circuit may be carried out during wafer level testing where the first and second bias voltage pads of the integrated circuit are electrically connected or coupled to the equivalent test capacitor in absence of the capacitive MEMS transducer. The capacitance of the equivalent test capacitor may be approximately equal to the capacitance of a particular capacitive MEMS transducer of target microphone assembly. The capacitance of the capacitive MEMS transducer may, for example, lie between 0.5 pF and 10 pF. The present method of detecting leakage current from the DC bias voltage circuit may alternatively be carried out during assembly and production testing of the finished microphone assembly where the combined operation of the integrated circuit and capacitive MEMS transducer is tested. In either case, integrated circuits and microphone assemblies failing the leakage current test may be identified and scrapped or screened out.

A second aspect of the disclosure relates to a microphone assembly comprising: a housing having a host device interface, a capacitive MEMS transducer disposed in the housing, said transducer configured to convert sound into an electrical signal at a transducer output. An integrated circuit is disposed in the housing and electrically coupled to the host device interface and to the capacitive MEMS transducer via first and second bias voltage pads. The integrated circuit further comprises: a DC bias voltage circuit configured to generate a first DC bias voltage, a test signal generator coupled to the DC bias voltage circuit and configured to generate a test signal with a predetermined frequency and level, wherein the test signal is superimposed onto the first DC bias voltage, a lowpass filter coupled between the DC bias voltage circuit and the first bias voltage pad of the integrated circuit, the lowpass filter configured to suppress noise from the first DC bias voltage, a buffer or preamplifier circuit comprising an input electrically coupled to the second bias voltage pad; wherein the test signal is provided at the host device interface after buffering or amplification.

In some embodiments, the integrated circuit further includes an analog-to-digital converter (ADC) connected to an output of the buffer or preamplifier circuit and configured to generate a digital test signal by sampling and quantizing the test signal after buffering and amplification, and a data communication interface coupled to the host device interface of the housing, where the digital test signal is provided at the host device interface. In some embodiments, the DC bias voltage circuit comprises a programmable reference voltage generator and a boost DC-DC converter circuit; where programmable reference voltage generator is configured to supply a reference voltage to a reference voltage input of the boost DC-DC converter circuit, the programmable reference voltage generator being configured to modulate, at the predetermined frequency, an output of the programmable reference voltage generator between at least two different voltages. In some embodiments, the output of the programmable reference voltage is modulated by writing a sequence of instructions to the programmable reference voltage generator via the data communication interface. In some embodiments, the DC bias voltage is in a range of 20 Volts to 50 Volts.

A third aspect of the disclosure relates to an integrated circuit for coupling to a capacitive MEMS transducer disposed within a housing of a microphone assembly. The integrated circuit comprises: first and second bias voltage pads connectable to electrodes of a capacitive MEMS transducer and a DC bias voltage circuit configured to generate a first DC bias voltage. A lowpass filter is coupled between an output of the DC bias voltage circuit and the first bias voltage pad of the integrated circuit, the lowpass filter configured to suppress noise from the first DC bias voltage. The integrated circuit further comprises: a test signal generator coupled to the DC bias voltage circuit and configured to generate a test signal with a predetermined frequency and level, wherein the test signal is superimposed onto the first DC bias voltage; a buffer or preamplifier circuit comprising an input electrically coupled to the second bias voltage pad, wherein the test signal is buffered or amplified when the second DC bias voltage is applied to first and second bias voltage pads of the integrated circuit in the presence of the capacitive MEMS transducer. In some embodiments, the DC bias voltage circuit includes a programmable reference voltage generator and a boost DC-DC converter circuit; said programmable reference voltage generator connected to a reference voltage input of the boost DC-DC converter for setting a level of the first DC bias voltage; the test signal generator is configured to modulate, at the predetermined frequency, the programmable reference voltage generator and applying a modulated output of the reference voltage generator to the reference voltage input of the boost DC-DC converter.

FIG. 1 shows a vertical cross-sectional view through a housing 103 of a miniature microphone assembly 100 in accordance with an embodiment of the invention. In the present embodiment, the MEMS transducer element 102 comprises a capacitive sound transducer for capture and conversion of sound signals in the audible range, i.e. a capacitive MEMS transducer element 102. The capacitive MEMS transducer element 102 is configured to convert incoming sound within at least a part of the audible range between 20 Hz and 20 kHz into a corresponding transducer audio signal at a transducer output e.g. at a first pad (not shown) arranged on the MEMS transducer element 102. The capacitive MEMS transducer element 102 may, for example, exhibit a transducer capacitance between 0.5 pF and 10 pF. The microphone assembly 100 additionally includes an integrated circuit 122, which may include a semiconductor die, for example a mixed-signal CMOS semiconductor device integrating the various analog and digital circuits disclosed herein. The integrated circuit 122 may be shaped and sized for mounting on a substrate or carrier element 111 of the assembly 100, where the carrier element 111 likewise supports the capacitive MEMS transducer element 102. The microphone assembly 100 includes a housing which comprises a lid 103 mounted onto a peripheral edge of the substrate or carrier element 111 such that the lid 103 and carrier element 111 jointly form the microphone housing enclosing and protecting the MEMS transducer element 102 and integrated circuit 120 from contaminants of the external environment such as dust, moisture, heat, EMI signals. The microphone housing 103 may include a sound inlet or sound port 109 projecting through the carrier element 111, or through the lid 103 in other embodiments, for conveying sound waves to the MEMS transducer element 102.

The capacitive transducer element 102 may include first and second mutually charged transducer electrodes or plates, e.g., a diaphragm 135 and a perforated back plate 136, respectively, supplying the transducer audio signal. The electrical charge may be injected onto one of the diaphragm 135 and back plate 136 through first and second transducer pads (not shown) by an appropriate high-impedance DC bias voltage circuit (refer to FIG. 2) of the integrated circuit 122. The DC bias voltage circuit is configured to generate a first DC bias voltage and a second DC bias voltage where the latter is coupled to the diaphragm 135 and perforated back plate 136 via first and second bias voltage pads (items 150, 152 of FIG. 2) of the integrated circuit and via the first and second transducer pads. The electrical connection from the first bias voltage pad 150 to the first transducer pad may comprise a bonding wire 107 or other electrical wire and the electrical connection from the second bias voltage pad 152 to the second transducer pad by similar wiring. Alternatively, the MEMS transducer element 102 may be a piezoelectric element or some other known or future transducer requiring a DC bias voltage to operate.

Figure 2:
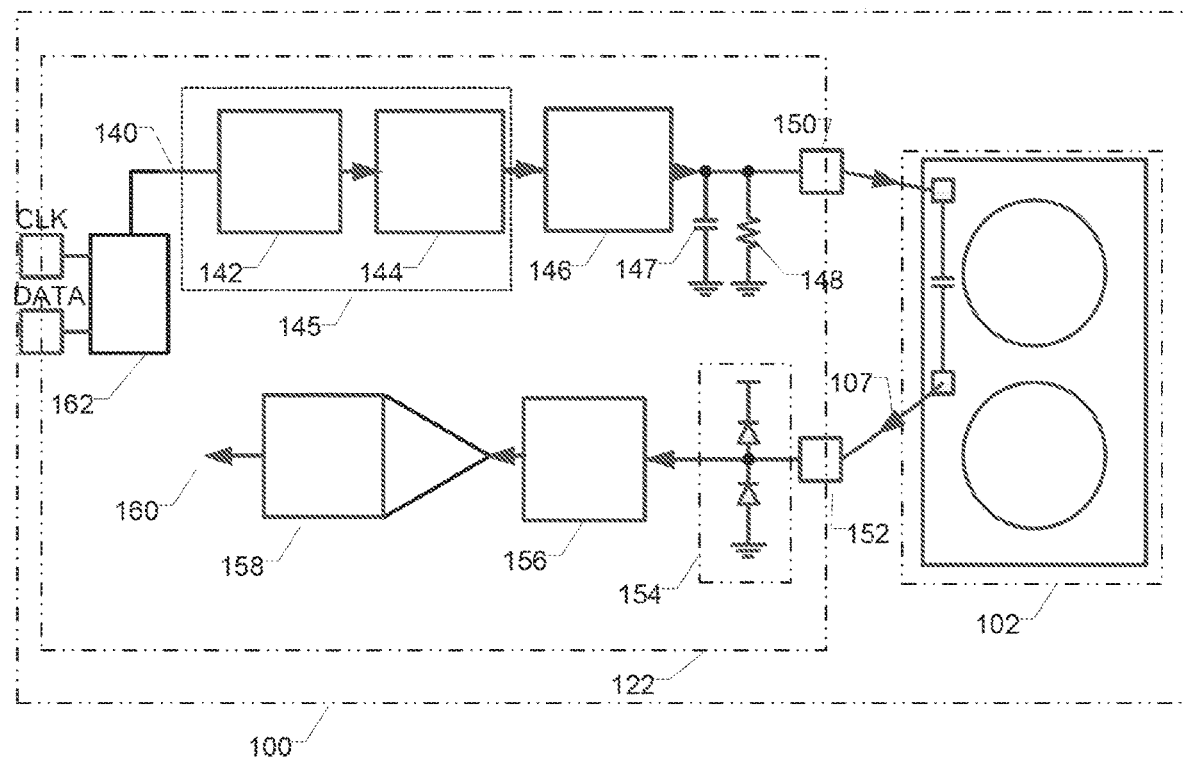
FIG. 2 shows a simplified electrical block diagram of the miniature microphone assembly.

FIG. 2 shows a simplified electrical block diagram of the previously-discussed miniature microphone assembly 100. The integrated circuit 122 of the miniature microphone assembly 100 is electrically coupled or connected to the MEMS transducer element 102 via the first and second bias voltage pads 150, 152, first and second bonding wires 107, 109, or similar electrical wiring for example provided on the substrate or carrier element 111, and the first and second transducer pads. The integrated circuit 122 comprises the DC bias voltage circuit 145 which preferably comprises a reference voltage generator 142 and a boost DC-DC converter circuit 144. The boost DC-DC power converter 144 may include a switched capacitor (SC) converter, charge pump or switched capacitor voltage multiplier. The reference voltage generator 142 is configured to generate a stable reference voltage, such as a DC voltage between 0.5 V and 1.0 V, for a reference voltage input 143 of the boost DC-DC converter 144. The boost DC-DC converter 144 is configured to multiply the provided reference voltage with a certain factor, e.g. 5-20, to generate the first DC bias voltage. The first DC bias voltage may be set to between 20 and 50 Volt such as between 30 and 40 Volt depending on physical properties of the MEMS transducer element 102.

The reference voltage generator 142 of the present embodiment of the integrated circuit 122 is digitally programmable or adjustable via the programming input 140 such that a test signal may be generated on-chip by the reference voltage generator 142 and superimposed onto the DC bias voltage, in particular when the integrated circuit 122 operates in a bias leakage current test mode as discussed below. The skilled person will understand that the test signal in alternative embodiments of the DC bias voltage circuit 145 may be generated by an external, or off-chip, signal generator and coupled into the DC bias voltage circuit via an externally accessible input pad of the integrated circuit 122.

In the present embodiment, the programming input 140 of the reference voltage generator 142 is coupled to a data communication interface 162 of the integrated circuit 122. The data communication interface 162 may be coupled to a host device interface 124 provided on the housing of the microphone assembly 100 for example on the carrier element 111. The reference voltage outputted by the reference voltage generator 142 may be toggled between at least two different voltage levels or current levels to generate the above-mentioned test signal by writing a suitable sequence of instructions or data commands to the reference voltage generator 142 through the data communication interface 162. More specifically, the sequence of data commands may be written with a certain timing such that the toggling of the reference voltage takes place with a certain desired or predetermined frequency to modulate the reference voltage such that the latter includes a fundamental voltage component at the desired frequency of the test signal. The frequency of the test signal may for example lie between 10 Hz and 200 Hz. A modulated output of the reference voltage generator 142, now toggling at the desired frequency, is applied to the reference voltage input of 143 of the boost DC-DC converter 144 which multiplies the instantaneous value of the reference voltage such that the first DC bias voltage outputted by the DC bias voltage circuit 145 comprises a DC component and a modulated signal component, which corresponds to the test signal, superimposed thereon. The fundamental frequency component of test signal is at the desired frequency of the test signal. Furthermore, the skilled person will understand that the programmable property of the reference voltage generator 142 may be pre-existing feature of the reference voltage generator 142 implemented for another purpose than bias voltage leakage testing such as production trimming of the first DC bias voltage of the DC bias voltage circuit. Consequently, the on-chip test signal generator of the integrated circuit 122 according to the present embodiment minimizes the number of separate components, circuits and external pads of the integrated circuit 122.

The data communication interface 162 may comprise a clock line CLK and a data line DATA and may be unidirectional or bi-directional. The data communication interface 162 of the integrated circuit 122 may include a proprietary data interface or a standardized data interface, such as one of I²C, USB, UART, SoundWire, SPI or legacy PDM compliant data communication interfaces. Various types of configuration data and/or commands of the integrated circuit 122, such as the toggle commands to the reference voltage generator 142, may be transmitted from a test jig or computer, host processor or application processor to the miniature microphone assembly through the data communication interface 162.

The DC bias voltage, including the superimposed test signal component, supplied by the DC bias voltage circuit 145 is applied to an input of a diode-based lowpass filter 146 which is coupled between the first DC bias voltage and the second DC bias voltage applied at the first bias voltage pad 150. During normal operation of the integrated circuit 122, i.e. where the test signal generator is off/interrupted, the role of the diode-based lowpass filter 146 is to suppress or attenuate ac ripple voltages and/or noise components on the first DC bias voltage such that the second DC bias voltage at the first bias voltage pad 150 is a low-noise DC voltage with reduced noise level. The skilled person will appreciate that such ripple voltages and/or noise components may be coupled to the first DC bias voltage by numerous independent noise sources such as the switching operation of the boost DC-DC converter 144, data transitions of the data communication interface, clock signals on the integrated circuit etc.

The diode-based lowpass filter 146 comprises one or several diodes connected between the input 145 and an output of the filter 146 and additionally a capacitor CCP 147 which is connected from the output to ground or similar ac ground potential of the integrated circuit 122. The output impedance of the diode-based lowpass filter 146 as seen at the second DC bias voltage provided on the first bias voltage pad 150 is extremely high inter alia because of the extremely high ac impedance of reversed biased, or substantially unbiased, semiconductor diode or diodes that are connected in series with the first DC bias voltage outputted by the DC bias voltage circuit 145 as discussed below. However, an undesired leakage current may be drawn from the second DC bias voltage due to various types of manufacturing faults and contaminations of the integrated circuit 122 as discussed above. The presence of this undesired leakage current is symbolically illustrated on the drawing by equivalent leakage resistance element RCP_LEAk 148 which is connected from the second DC bias voltage to ground. The skilled person will understand that leakage resistance element 148 is merely schematic and may represent one or several current leakage paths from different components of the DC bias voltage circuit, bias voltage pads 150, 152, the diode(s) of the diode-based lowpass filter 146 etc. However, the leakage resistance element 148 draws the leakage current through the one or more diodes of the diode-based lowpass filter 146 which significantly reduces the series resistance of the lowpass filter 146 which in turn significantly increases a cut-off or corner frequency of the diode-based lowpass filter 146 as discussed below.

When the miniature microphone assembly 100, in particular the integrated circuit 122, is operated in the leakage current test mode, the test signal generator is active and the test signal, or pilot tone, is coupled to the first bias voltage pad 150 via the diode-based lowpass filter 146. The diode-based lowpass filter 146 is, however, preferably designed with a nominal cut-off or corner frequency around 0.1 Hz-1 Hz such that the lowpass filter 146 attenuates the test signal with a large amount for example more than 40 dB or 60 dB if the test signal has frequency placed well above the cut-off frequency of the lowpass filter 146, such as a test signal frequency between 20 Hz and 100 Hz, and the leakage resistance 148 has a nominal value which reflects a healthy condition of the integrated circuit 122. Under the latter circumstances, experimental data collected by inventors suggest that the resistance of the leakage resistance element 148 is larger than 1 TΩ, such as about 2.5 TΩ. On the other hand if the integrated circuit 122 is unhealthy or damaged, the inventors' experimental data shows that the resistance of the leakage resistance element 148 may be less than 100 GΩ such as less than 50 GΩ or even less than 10 GΩ.

The cut-off frequency of the diode-based lowpass filter 146 can be calculated by:

$$f_{3dB} = \frac{I_{DC\_LEAK}}{2*\pi*V_t*C_{CP}}$$

IDC_LEAK represents a leakage current drawn from the DC bias voltage,
CCP represents the capacitance of the capacitor CCP 147;
Vt=kT/q represents the thermal voltage of the diodes of the diode-based lowpass filter 146.

Hence, the cut-off frequency of the diode-based lowpass filter 146 is directly proportional to the leakage current drawn from the DC bias voltage such that the cut-off frequency of the lowpass filter 146 increases proportionally with increasing leakage current. Hence, if the resistance of the leakage resistance element 148 is about 1 TΩ, which indicates a healthy condition of the circuit 122, the cut-off frequency may lie around 0.5 Hz as suggested above. Conversely, if the circuit 122 is unhealthy the resistance of the leakage resistance element 148 may be about 50 GΩ leading to twenty-fold increase of the cut-off frequency of the diode-based lowpass filter 146 to e.g. 10 Hz.

During the leakage current test of the miniature microphone assembly 100, the cut-off frequency of the diode-based lowpass filter 146 is estimated, determined or measured by measuring the level of the test signal at the output of the microphone buffer or preamplifier. The test signal is coupled through the capacitance of MEMS transducer element 102, or through the equivalent test capacitor, as the case may be, to the second bias voltage pad 152. The input of a microphone buffer or preamplifier 156 is electrically connected to the second bias voltage pad 152 which is electrically coupled or connected to the output of the MEMS transducer element 102 for receipt and buffering or amplification of the test signal. The input of a microphone buffer or preamplifier 156 is preferably DC biased, and optionally protected against ESD and overvoltage, by a pair of anti-parallel protection diodes 154 in a conventional manner.

The skilled person will understand that the level of the test signal at the output of the microphone buffer 156 can be detected in numerous ways in the analog domain or digital domain. The present embodiment of the proposed methodology of detecting leakage current from the DC bias voltage circuit utilizes an analog-to-digital converter 158 (ADC) coupled to the output of the microphone buffer or preamplifier 156. The ADC 158 is configured to sample and quantize the test signal to generate a corresponding digital test signal at the output 160 of the ADC. The digital test signal may be transmitted to an external test system or test jig (not shown) via the host interface 124 of the microphone assembly and a data communication interface 162 of the integrated circuit. The digital test signal may be encoded according to a communication protocol of the data communication interface 162 before being transmitted through the DATA line. The external test system may comprise a suitably configured computer, e.g. running a measurement application program or software such as LabVIEW, to measure the level of test signal as received through a data communication interface of the test computer.

In one embodiment of the present methodology, the test computer is configured to compare the level of the digital test signal to a reference such as predetermined or pre-set level criterion and categorizing the integrated circuit 122, or the entire microphone assembly 100, as the case may be failing or passing the leakage current test depending on the outcome of the comparison. The skilled person will understand that the reference may be determined in various ways for example based on circuit simulations or statistical analysis of the level of the test signal at the output of the microphone buffer or preamplifier 156 from a plurality of "known good" integrated circuits 122 or miniature microphone assembles 100. Hence, the predetermined level criterion may comprise a level threshold which is set based on an average test signal level generated by the plurality of the "known good" integrated circuits 122 subjected to the leakage current test mode. Integrated circuit 122 in which a level of the test tone exceeds the level threshold are categorized as test failures and may be rejected during microphone assembly manufacturing or a subsequent quality control. The rejected integrated circuits 122 or rejected microphone assemblies 100 may subsequently be subjected to various diagnostic analyses and tests to determine an exact cause of the failure of the integrated circuit or microphone assembly, since several possible failure mechanisms often exist as discussed in detail above.

Figure 3:
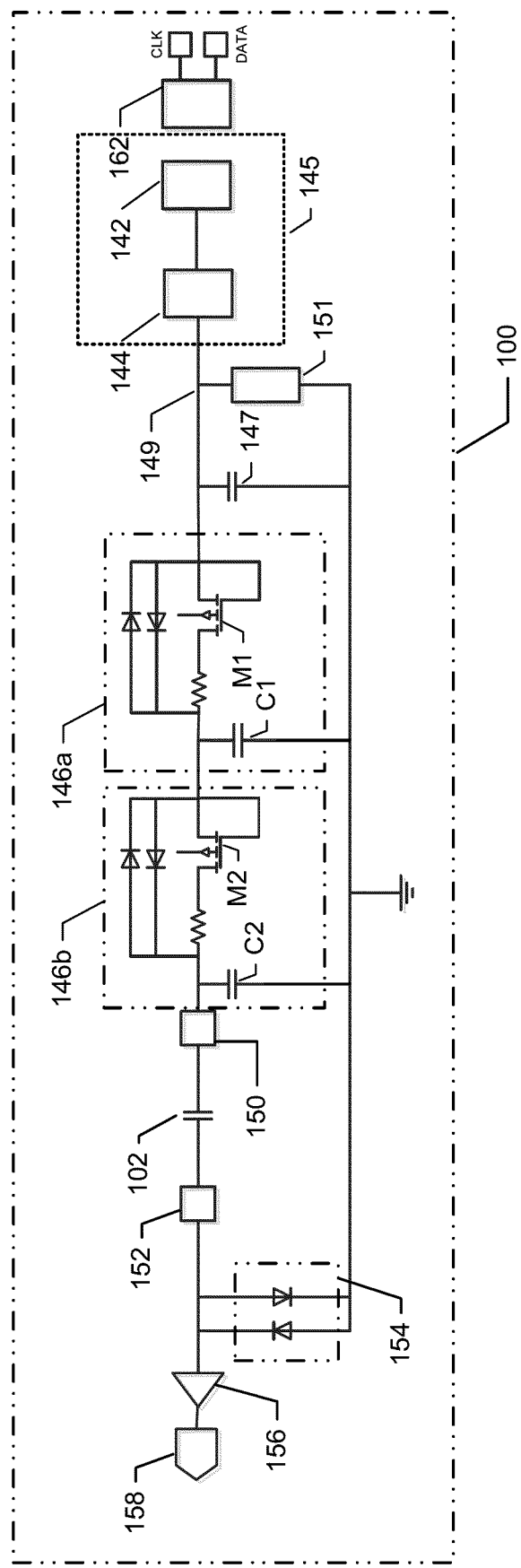
FIG. 3 shows a more detailed electrical circuit diagram of the integrated circuit of the miniature microphone assembly.

FIG. 3 shows a more detailed electrical circuit diagram of the integrated circuit 122 of the previously-discussed miniature microphone assembly 100 compared to FIG. 2. The capacitive MEMS transducer element 102, or the equivalent test capacitor 102, is electrically connected to the integrated circuit 122 via the first and second bias voltage pads 150, 152 as discussed above. In the illustrated embodiment the diode-based lowpass filter 146 comprises a cascade of two separate first order lowpass filter sections 146a, 146b. Each of the first order lowpass filter sections comprises a pair of anti-parallel diodes in series with the DC bias voltage line 149 and a capacitor to ground. The skilled person will appreciate that alternative embodiments of the diode-based lowpass filter 146 may comprise fewer or more separate lowpass filter sections and higher order lowpass filter sections. Each of the first order lowpass filter sections may additionally comprise a diode-connected MOSFET transistor M1, M2 coupled in parallel with the pair of the anti-parallel diodes as illustrated for the purpose of setting a well-defined minimum resistance of the lowpass filter section when to voltage across the pair of the anti-parallel diodes approaches zero. A capacitor C1 is connected to from the output of the anti-parallel diodes to ground in the first order lowpass filter section 146a. C1 may have a capacitance between 5 and 25 pF in exemplary embodiments of the diode-based lowpass filter 146. In the second first order lowpass filter section 146 another capacitor C2 is likewise connected to from the output of the anti-parallel diodes to ground. C2 may have a capacitance between 10 and 50 pF in exemplary embodiments of the diode-based lowpass filter 146. A smoothing capacitor 147, e.g. with a capacitance between 1 and 5 pF, may be coupled from the output of the boost DC-DC converter 144 of the DC bias voltage circuit 145 to ground to make an initial suppression of ripple and noise on the first DC output voltage even before the lowpass filtration effected by the diode-based lowpass filter 146. ESD protection diodes 151 may be coupled from the output of the boost DC-DC converter 144 of the DC bias voltage circuit 145 to ground to protect active components of the boost DC-DC converter 144 from overvoltage damage.

Figure 4:
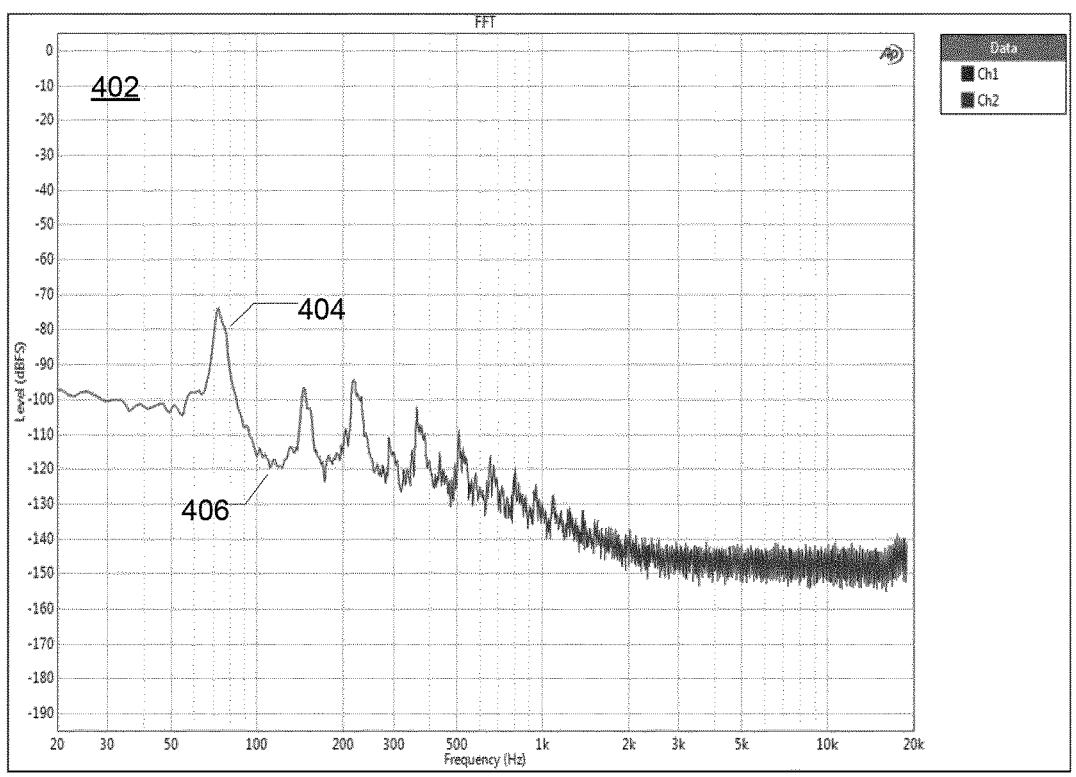
FIG. 4 shows respective frequency spectra of a digital test signal captured under an exemplary leakage current test of two different integrated circuit samples of the miniature microphone assembly.
Figure 4:
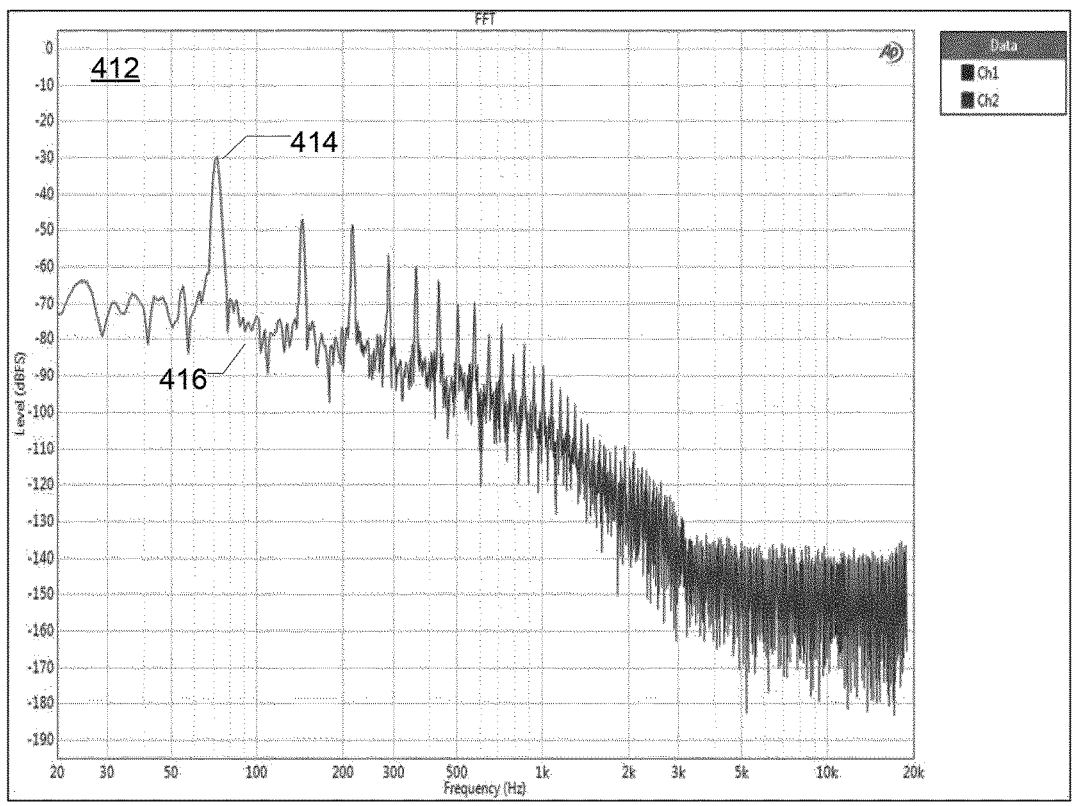

The upper and lower plots 402, 404 of FIG. 4 show respective measured frequency spectra of the digital test signal at the output 160 of the ADC of the integrated circuit 122 in connection with performing the above-discussed leakage current test of the integrated circuit 122 where the capacitive MEMS transducer element 102 is represented by the equivalent test capacitor. The equivalent test capacitor preferably possesses a capacitance that largely corresponds to the capacitance of the particular capacitive MEMS transducer element 102 of the microphone assembly under consideration. The test signal or pilot tone is generated on-chip by toggling of the reference voltage between two different levels at approximately 75 Hz and thereby modulating the DC output voltage of the bias voltage circuit as discussed above. The test signal has a fundamental frequency at 75 Hz but also includes a number of higher harmonic components due to the essentially rectangular waveform shape resulting from the level toggling as evident from the measured frequency spectrum. The upper plot 402 shows the frequency spectrum of a "known good" integrated circuit 122 while the lower plot 412 shows the frequency spectrum of a defective integrated circuit 122 where the bias leakage current is unacceptably high. The defect integrated circuit 122 is created artificially for test validation purposes by connecting a resistor with a resistance of about 50 GΩ from the second DC output voltage to ground. The 50 GΩ leakage resistance from the second DC bias voltage corresponds to a leakage current of about 0.5 nA for a DC bias voltage on 37 V.

The level of the fundamental component 404 of the test signal is about minus 75 dB relative to a reference voltage for the "known good" integrated circuit 122 as evidenced by the upper plot 402. In contrast, for the defect integrated circuit 122, the level of the fundamental component 414 of the test signal is much higher at about minus 30 dB as evident from the lower plot 412. This represents a decrease of suppression of the test signal of about 45 dB or more than 100 times. This decrease of suppression of the test tone is caused by the increase of cut-off frequency of the diode-based lowpass filter 146 as discussed in detail above. Furthermore, this increase of cut-off frequency of the diode-based lowpass filter 146 also leads to an undesired increase of overall noise floor of the second DC bias voltage at lower frequencies, e.g. below 500 Hz, as evident by comparing noise floor 406 of the upper plot 402 with noise floor 416 of the lower plot 412.

Consequently, the level threshold of the leakage current test may be to a value somewhere between minus 60 dB and minus 40 dB under the above-outlined measurement conditions in order to distinguish between defect/failing integrated circuits and "good"/passing integrated circuits. The skilled person will appreciate that the experimental results above demonstrates the extremely high sensitivity of present leakage current test of the integrated circuit 122 such that it is capable of readily detecting very small bias current leaks, e.g. below 0.5 nA, by measuring and evaluating the level of the test signal. In effect, a very difficult, or even practically impossible, DC current leakage measurement on the DC bias voltage is converted into straight-forward ac signal measurement. This ac signal measurement may furthermore be carried out by exploiting already existing circuit blocks of the integrated circuit 122, e.g. toggling the programmable reference voltage generator to create the test signal or pilot tone and detecting the resulting test signal through the microphone signal path which is used for amplification of the audio signal generated by the MEMS element in response to incoming sound during normal operation.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of detecting leakage current from a DC bias voltage circuit of an integrated circuit for a capacitive microelectromechanical systems (MEMS) transducer, said method comprising:
   generating a first DC bias voltage by a DC bias voltage circuit, lowpass filtering the first DC bias voltage to generate a second DC bias voltage,
applying the second DC bias voltage to first and second bias voltage pads of the DC bias voltage circuit when the capacitive MEMS transducer, or an equivalent test capacitor, is coupled to the first and second bias voltage pads;
superimposing a test signal with a predetermined frequency and level onto the first DC bias voltage when the second DC bias voltage is applied to the first and second bias voltage pads;
detecting a level of the test signal after buffering or amplifying the test signal with a microphone buffer or preamplifier of the integrated circuit coupled to an output of the capacitive MEMS transducer, or through the equivalent test capacitor;
comparing the test signal to a reference after buffering or amplifying; and
determining whether the integrated circuit failed or passed a leakage current test based on the comparison.

2. The method of claim 1, wherein superimposing the test signal includes superimposing a test signal having a fundamental frequency between 10 Hz and 200 Hz.

3. The method of claim 1, wherein superimposing the test signal includes generating the test signal with a signal generator of the integrated circuit and coupling the test signal into the DC bias voltage circuit.

4. The method of claim 3, further comprising generating the test signal by modulating, at the predetermined frequency, a programmable reference voltage generator of the DC bias voltage circuit and applying a modulated output of the programmable reference voltage generator to a reference voltage input of a boost DC-DC converter of the DC bias voltage circuit.

5. The method of claim 4, comprising modulating the output of the reference voltage input by writing a sequence of instructions through a data communication interface of the integrated circuit to the reference voltage generator to toggle, at the predetermined frequency, an output voltage or current of the reference voltage generator between at least two different levels.

6. The method of claim 1, wherein superimposing the test signal includes applying the test signal generated by an external signal generator to a communication interface of the integrated circuit and coupling the test signal into the DC bias voltage circuit.

7. The method of claim 1 further comprising:
generating a digital test signal by sampling and quantizing the test signal with an analog-to-digital converter (ADC) of the integrated circuit after buffering or amplifying the test signal, and transmitting the digital test signal from the integrated circuit via a data communication interface of the integrated circuit before detecting the level of the test signal.

8. The method of claim 1, wherein the lowpass filtering of the first DC bias voltage includes applying the first DC bias voltage via a pair of antiparallel diodes coupled in series with the first DC bias voltage, and via a filter capacitor coupled from an output of the pair of antiparallel diodes to a ground potential of the integrated circuit.

9. The method of claim 1, further comprising selecting a fundamental frequency of the test signal such that it is least one decade higher than a nominal cut-off frequency of a lowpass filter performing the lowpass filtering of the first DC bias voltage.

10. A microphone assembly comprising:
a housing having a host device interface,
a capacitive MEMS transducer disposed in the housing, said transducer configured to convert sound into an electrical signal at a transducer output;
an integrated circuit disposed in the housing and electrically coupled to the host device interface and to the capacitive MEMS transducer via first and second bias voltage pads;
said integrated circuit further comprising:
a DC bias voltage circuit configured to generate a first DC bias voltage,
a test signal generator coupled to the DC bias voltage circuit and configured to generate a test signal with a predetermined frequency and level, wherein the test signal is superimposed onto the first DC bias voltage,
a lowpass filter coupled between the DC bias voltage circuit and the first bias voltage pad of the integrated circuit, the lowpass filter configured to suppress noise from the first DC bias voltage,
a buffer or preamplifier circuit comprising an input electrically coupled to the second bias voltage pad;
wherein the test signal is provided at the host device interface after buffering or amplification.

11. The assembly of claim 10, wherein the integrated circuit further comprises:
an analog-to-digital converter (ADC) connected to an output of the buffer or preamplifier circuit and configured to generate a digital test signal by sampling and quantizing the test signal after buffering and amplification,
a data communication interface coupled to the host device interface of the housing, wherein the digital test signal is provided at the host device interface.

12. The assembly of claim 11, wherein the DC bias voltage circuit comprises a programmable reference voltage generator and a boost DC-DC converter circuit ; wherein programmable reference voltage generator is configured to supply a reference voltage to a reference voltage input of the boost DC-DC converter circuit,
said programmable reference voltage generator being configured to modulate, at the predetermined frequency, an output of the programmable reference voltage generator between at least two different voltages.

13. The assembly of claim 12, wherein the output of the programmable reference voltage is modulated by writing a sequence of instructions to the programmable reference voltage generator via the data communication interface.

14. The assembly of claim 10, wherein an impedance, at 1 kHz, between at the first bias voltage pad and ground of the integrated circuit is larger than 50 GΩ.

15. The assembly of claim 10, wherein the lowpass filter is a diode-based lowpass filter.

16. The assembly of claim 10, wherein the test signal has a fundamental frequency between 10 Hz and 200 Hz.

17. The assembly of claim 10, wherein the DC bias voltage is in a range of 20 Volts to 50 Volts.

18. The assembly of claim 10, wherein a capacitance of the capacitive MEMS transducer, or a capacitance of the equivalent test capacitor, lies between 0.5 pF and 10 pF.

19. An integrated circuit for coupling to a capacitive MEMS transducer disposed within a housing of a microphone assembly, the integrated circuit comprising:
first and second bias voltage pads connectable to electrodes of a capacitive MEMS transducer;
a DC bias voltage circuit configured to generate a first DC bias voltage;

a lowpass filter coupled between an output of the DC bias voltage circuit and the first bias voltage pad of the integrated circuit, the lowpass filter configured to suppress noise from the first DC bias voltage, a test signal generator coupled to the DC bias voltage circuit and configured to generate a test signal with a predetermined frequency and level, wherein the test signal is superimposed onto the first DC bias voltage;

a buffer or preamplifier circuit comprising an input electrically coupled to the second bias voltage pad, wherein the test signal is buffered or amplified when the second DC bias voltage is applied to first and second bias voltage pads of the integrated circuit in the presence of the capacitive MEMS transducer;

an analog-to-digital converter (ADC) connected to an output of the buffer or preamplifier circuit and configure to generate a digital test signal by sampling and quantizing the buffered or amplified test signal; and a data communication interface configured to transmit the digital test signal from the integrated circuit.

20. The circuit of claim 19, wherein an impedance, at 1 kHz, between the first bias voltage pad and ground of the integrated circuit is 50 GΩ or more.

21. The circuit of claim 19, wherein a fundamental frequency of the test signal is least one decade higher than a nominal cut-off frequency of the lowpass filter.

22. The circuit of claim 19, wherein the DC bias voltage circuit comprises a programmable reference voltage generator and a boost DC-DC converter circuit; said programmable reference voltage generator connected to a reference voltage input of the boost DC-DC converter for setting a level of the first DC bias voltage; the test signal generator is configured to modulate, at the predetermined frequency, the programmable reference voltage generator and applying a modulated output of the reference voltage generator to the reference voltage input of the boost DC-DC converter.

23. The circuit of claim 22, wherein the output of the programmable reference voltage generator is modulated by writing a sequence of instructions through a data communication interface of the integrated circuit to the programmable reference voltage generator.

24. The circuit of claim 23, wherein the output of the programmable reference voltage generator is modulated by toggling, at the predetermined frequency, an output voltage or current of the programmable reference voltage generator between at least two different levels.

25. The circuit of claim 19, wherein the lowpass filter is a diode-based lowpass filter comprising a pair of anti-parallel diodes.

* * * * *